ENCAPSULED PHOTOELECTRIC SEMICONDUCTOR DEVICE
Filed May 19, 1960
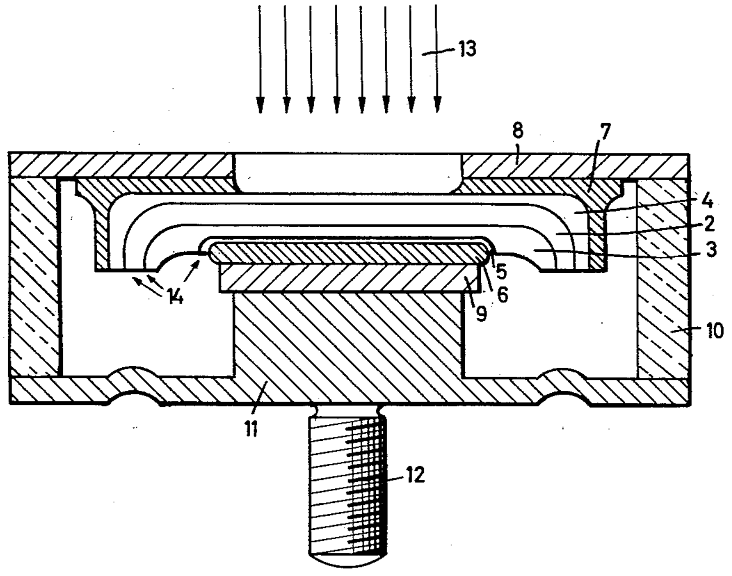

2,999,940
ENCAPSULED PHOTOELECTRIC SEMICONDUCTOR DEVICE

Arnulf Hoffmann, Schloss, Pretzfeld, Upper Franconia, and Walter Hartel, Nurnberg, Germany, assignors to Siemens-Schuckertwerke Aktiengesellschaft, Berlin-Siemensstadt, Germany, a corporation of Germany Filed May 19, 1960, Ser. No. 30,127
Claims priority, application Germany May 29, 1959
2 Claims. (Cl. 250—211)

Our invention relates to photoelectric semiconductor devices of the junction type in which a semiconductor body has four regions of consecutively different type of conductance so as to form p-n and n-p junctions.

According to the copending application of R. Emeis, Serial No. 794,735, filed February 20, 1959 and assigned to the assignee of the present invention, the electrode-carrying semiconductor wafer of such a device can be gas-tightly encapsuled in such a manner that the photosensitive area of the wafer, constituted by the surface of a fusion-bonded recrystallization layer, forms a portion of the exterior surface of the capsule. This is done preferably by first alloying a metal foil onto one of the flat sides of the wafer and thereafter etching part of the alloyed layer away, down to the recrystallization layer while preserving a ring or frame shaped marginal portion of the original alloy layer. Then a flat ring of tungsten or molybdenum with an outer diameter larger than the wafer diameter is mounted on that electrode. This structure serves as a portion of the gas-tight housing which is completed by a tubular wall member and a cover. The semiconductor devices thus produced according to said prior application constitute p-n phototransistors.

It is an object of our invention to provide an encapsuled semiconductor device capable of operating as a photoelectrically triggered switching diode having a semiconductor wafer with four layers of consecutively opposite type of conductivity so as to form an n-p-n-p triple junction.

It is a more specific object of our invention to provide a photoelectric switching diode on the basis of a silicon n-p-n-p type body with a photo sensitive surface forming a portion of the exterior surface of a gas-tight housing.

A further object of our invention is to provide photoelectric semiconductor switching devices comprising a four-layer, three-junction semiconductor body, in which all damage-susceptible localities of the semiconductor body, particularly the boundaries of the junctions where they emerge at the surface of the body, are protected within the gas-tight housing while nevertheless the photosensitive area of the semiconductor body remains freely exposed to ingress of light or other electromagnetic radiation.

These and further objects and advantages of our invention will be apparent from the following description of an embodiment, taken together with the accompanying drawing showing, in section and on enlarged scale, a four-layer photoelectric semiconductor device according to the invention, the thickness being somewhat distorted for the sake of clarity.

The illustrated device comprises a circular semiconductor wafer 2, consisting of preferably p-type silicon having a very high specific resistance, such as about 100 ohm cm. In a preparatory step of production, a foil (not shown) made of a gold-bismuth alloy (about 0.3% Bi and about 99.7% An) and having a diameter slightly smaller than that of the wafer, is alloyed into one of the large-area faces of the wafer by a heating process, whereby a recrystallization stratum of n-type silicon is formed, as indicated at 3 in the drawing. This stratum, being medium-doped with a concentration of about $10^{17}$ to $10^{18}$ bismuth atoms per ccm., is adjacent to a silicon region that preserved its original p-type conductance and high-ohmic resistance and that carries a surface layer of a gold-silicon-bismuth eutectic alloy. Thereafter this surface stratum is etched away by means of aqua regia.

Now, a foil of still smaller diameter, made of a gold-boron-bismuth alloy (about 0.2% B, 0.3% Bi, remainder gold) is alloyed into the recrystallization layer 3, and another foil made of a gold antimony alloy (about 0.5% Sb, remainder gold) is alloyed into the opposite face of the wafer, the latter foil having a diameter slightly larger than that of the silicon wafer. Thus, a new recrystallization layer 4 of highly conducting, n-type silicon is formed with a portion 2 of the silicon wafer remaining in its original p-type, high-resistance condition. A portion of the recrystallization layer 3 is reversely doped and now forms a p-type layer 5 of high conductivity.

The layer 5 carries an electrode 6 of a gold-boron-silicon-bismuth eutectic alloy, and the layer 4 an electrode 7 of a gold-antimony-silicon eutectic alloy. The electrode 7, due to the larger diameter of the original gold-antimony foil, also extends over the peripheral edge of the silicon wafer as shown.

As a further step of production, a ring-shaped member 8 of tungsten or molybdenum is alloyed onto the electrode 7. It is preferable to previously coat this member 8 with gold, for example by electroplating. Thereafter, the central portion of the electrode 7 is etched away with aqua regia, thus exposing the surface of the recrystallization layer 4 at this location.

On the opposite side of the wafer, a circular disc 9 of tungsten or molybdenum, also coated with gold, is alloyed onto the electrode 6. Preferably, the diameter of disc 9 is made larger than the inner diameter of the ring-shaped member 8, so that both parts together serve as a mechanical support for the thin semiconductor wafer.

By thereafter adding a cylindrically tubular housing portion 10 and a metal cover 11, a gas-tight capsule is formed about the semiconductor body. The housing portion 10 is preferably made of a ceramic material and metallized on the end surfaces to facilitate joining it with parts 8 and 11 by soldering or alloying. The central portion of the cover 11 is preferably designed as a cooling block and is joined with the disc 9 by soldering. The metal cover 11 is advantageously made resilient, and for this purpose is given a wavy cross section, for compensating mechanical stresses. A screw bolt 12, preferably integral with the metal cover 11, permits fastening the device to a heat sink or supporting member.

In operation, the positive terminal of a voltage source, not shown, is connected with electrode 6, the negative terminal with electrode 7. As a result, the p-n junctions between the strata 5 and 3, and between strata 2 and 4 are stressed in the forward direction, whereas the n-p junction between strata 3 and 2 is stressed in the inverse or cut-off direction. This junction can now be made permeable by injection of charge carriers due to radiation, indicated by arrows 13, which may have a wavelength in the range of visible light or in the range of infrared. This radiation, directed onto the exposed surface of the stratum 4, serves to trigger the switching diode. Since the radiation directly impinges upon the photoelectrically active surface of the semiconductor body, it is not subjected to absorption or reflection by glass or other transparent materials. Nevertheless, the sensitive boundaries of the respective p-n junctions, where they emerge at the surface of the semiconductor body, are located within, and protected by, the gas-tight housing. Consequently, once the boundary area at the semiconductor surface has been cleaned from any conductive bridges by an etching process, they remain permanently protected from impurities or precipitated moisture. As described, the device has the further advantage that it can be made by an alloying process requiring relatively low temperatures for the bonding of the gold foils, as compared to the temperatures necessary for the diffusion method. As a result, the performance of the semiconductor device according to our invention is not impaired by the need for detrimentally high manufacturing temperatures.

Upon study of this disclosure, it will be apparent to those skilled in the art that numerous modifications are applicable. For example, the electrodes 6 and 7 may be insulated from each other by means other than the ceramic tubular member 10. Furthermore, semiconductor materials other than silicon are applicable. For example, the wafer can be made of n-type germanium of high specific resistance, and the p-doping can be effected by alloying an aluminum foil into the germanium crystal. For reversing the type of conductivity of a portion of the p-type region thus produced, the recrystallization layer can be exposed by etching with hydrochloric acid, and a gold-antimony foil can then be alloyed into the exposed recrystallization layer to produce an n-type region, all other steps of production being similar to those described for the silicon embodiment.

We claim:

1. A photoelectric semiconductor device comprising a disc-shaped crystalline semiconductor body having four successive strata of alternately different types of conductance between the two disc faces so as to provide three n-p junctions of which each is formed between two adjacent ones of said strata and inversely poled relative to the next following junction, two electrodes containing donor and acceptor substance respectively and being alloy-bonded to the two outer strata respectively at the disc faces of said semiconductor body, said two outer strata having lower ohmic resistance than said other two strata, one of said two electrodes being ring-shaped and leaving exposed a central portion of the adjacent semiconductor stratum to constitute a photosensitive area, and a capsule gas-tightly enclosing said semiconductor body and electrodes, said capsule being area-bonded to said two electrodes and having an opening through which said photosensitive area remains exposed.

2. A photoelectric semiconductor device comprising a disc-shaped monocrystalline body of silicon having four successive strata of n-type, p-type, n-type, and p-type conductance respectively, the outer n-type and p-type strata being located at the two disc faces respectively and having small ohmic resistance as compared with the two intermediate strata, a ring-shaped electrode containing donor substance and being alloy-bonded to said outer n-type stratum so as to leave exposed a central surface portion of said latter stratum to constitute a photosensitive area, another electrode containing acceptor substance and alloy-bonded to said outer p-type stratum so as to cover said latter stratum with the exception of a marginal area, and a capsule gas-tightly enclosing said semiconductor body and electrodes, said capsule being area-bonded to said two elcetrodes and having an opening through which said photosensitive area remains exposed.

References Cited in the file of this patent

UNITED STATES PATENTS

| | | |
|---|---|---|
| 2,751,527 | Shower | June 19, 1956 |
| 2,898,474 | Rutz | Aug. 4, 1959 |
| 2,959,681 | Noyce | Nov. 8, 1960 |